United States Patent
Yu et al.

(10) Patent No.: US 11,784,224 B2
(45) Date of Patent: Oct. 10, 2023

(54) LATERAL BIPOLAR TRANSISTOR STRUCTURE WITH BASE OVER SEMICONDUCTOR BUFFER AND RELATED METHOD

(71) Applicant: GlobalFoundries U.S. Inc., Malta, NY (US)

(72) Inventors: Hong Yu, Clifton Park, NY (US); Jagar Singh, Clifton Park, NY (US); Zhenyu Hu, Clifton Park, NY (US); John J. Pekarik, Underhill, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 56 days.

(21) Appl. No.: 17/455,290

(22) Filed: Nov. 17, 2021

(65) Prior Publication Data

US 2023/0061482 A1 Mar. 2, 2023

Related U.S. Application Data

(60) Provisional application No. 63/237,244, filed on Aug. 26, 2021.

(51) Int. Cl.
*H01L 29/10* (2006.01)
*H01L 29/417* (2006.01)
*H01L 29/423* (2006.01)
*H01L 29/40* (2006.01)
*H01L 29/737* (2006.01)
*H01L 29/66* (2006.01)
*H01L 29/735* (2006.01)
*H01L 29/08* (2006.01)

(52) U.S. Cl.
CPC ...... *H01L 29/1008* (2013.01); *H01L 29/0808* (2013.01); *H01L 29/0821* (2013.01); *H01L 29/401* (2013.01); *H01L 29/41708* (2013.01); *H01L 29/42304* (2013.01); *H01L 29/6625* (2013.01); *H01L 29/66242* (2013.01); *H01L 29/735* (2013.01); *H01L 29/737* (2013.01)

(58) Field of Classification Search
CPC .......... H01L 29/1008; H01L 29/66242; H01L 29/735; H01L 29/737
See application file for complete search history.

(56) References Cited

U.S. PATENT DOCUMENTS

| | | | |
|---|---|---|---|
| 6,949,764 B2 | 9/2005 | Ning | |
| 8,288,758 B2 | 10/2012 | Ning et al. | |
| 8,420,493 B2 | 4/2013 | Ning et al. | |
| 8,586,441 B1 | 11/2013 | Cai et al. | |
| 9,502,504 B2 | 11/2016 | Cai et al. | |
| 10,825,921 B2 | 11/2020 | Balakrishnan et al. | |
| 2015/0179778 A1* | 6/2015 | Cai | H01L 29/66265 257/557 |

* cited by examiner

*Primary Examiner* — Syed I Gheyas
(74) *Attorney, Agent, or Firm* — Francois Pagette; Hoffman Warnick LLC (57) ABSTRACT

The disclosure provides a lateral bipolar transistor structure with a base layer over a semiconductor buffer, and related methods. A lateral bipolar transistor structure may include an emitter/collector (E/C) layer over an insulator. The E/C layer has a first doping type. A semiconductor buffer is adjacent the insulator. A base layer is on the semiconductor buffer and adjacent the E/C layer, the base layer including a lower surface below the E/C layer and an upper surface above the E/C layer. The base layer has a second doping type opposite the first doping type.

20 Claims, 11 Drawing Sheets

LATERAL BIPOLAR TRANSISTOR STRUCTURE WITH BASE OVER SEMICONDUCTOR BUFFER AND RELATED METHOD

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs and/or operational parameters that do not meet certain constraints. Improving the electrical behavior of a bipolar transistor may provide related improvements in a device.

SUMMARY

The illustrative aspects of the present disclosure are designed to solve the problems herein described and/or other problems not discussed.

Aspects of the disclosure provide a lateral bipolar transistor structure including: an emitter/collector (E/C) layer over an insulator, the E/C layer having a first doping type; a semiconductor buffer adjacent the insulator; and a base layer on the semiconductor buffer and adjacent the E/C layer, the base layer including a lower surface below the E/C layer and an upper surface above the E/C layer, wherein the base layer has a second doping type opposite the first doping type.

Further aspects of the disclosure provide a lateral bipolar transistor structure including: a semiconductor substrate; an insulator on the semiconductor substrate; an emitter/collector (E/C) layer on the insulator, the E/C layer having a first doping type; a semiconductor buffer above the semiconductor substrate and adjacent the insulator, wherein the semiconductor buffer is below the E/C layer; and a base layer on the semiconductor buffer and adjacent the E/C layer, the base layer including a lower surface below the E/C layer and an upper surface above the E/C layer, the base layer having a second doping type opposite the first doping type.

Additional aspects of the disclosure provide a method of forming a lateral bipolar transistor structure, the method including: forming an emitter/collector (E/C) layer over an insulator, the E/C layer having a first doping type; forming a semiconductor buffer adjacent the insulator; and forming a base layer on the semiconductor buffer and adjacent the E/C layer, the base layer including a lower surface below the E/C layer and an upper surface above the E/C layer, wherein the base layer has a second doping type opposite the first doping type.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment"

or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a lateral bipolar transistor structure with a base layer that is located over a semiconductor buffer. The term "semiconductor buffer," as used herein, may refer to a layer of semiconductor material that is below a doped base region of bipolar transistor and is non-doped or oppositely doped. The lateral bipolar transistor structure may include an emitter/collector (E/C) layer, e.g., semiconductor material having a first doping type such as P type or N type doping. A semiconductor buffer is adjacent the insulator without abutting the E/C layer. A base layer is on the semiconductor buffer and adjacent the E/C layer. In this arrangement, the base layer may have a lower surface that is below the E/C layer (i.e., adjacent part of in the insulator) and an upper surface that is above the E/C layer. The base layer has a second doping type that is opposite the first doping type (i.e., N type when the E/C layer is doped P type and vice versa). Embodiments of the disclosure may allow the base layer to be of smaller horizontal width than conventional types of lateral bipolar transistors. In various implementations, the semiconductor buffer may be over another region of semiconductor material having the same doping type as the base layer, e.g., to improve heat transfer from the bipolar transistor structure to the substrate thereunder. Emitter, base, and collector terminals may be formed over the E/C layer and base layer to define the positions where conductive contacts may connect to the bipolar transistor structure.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Figure 1:
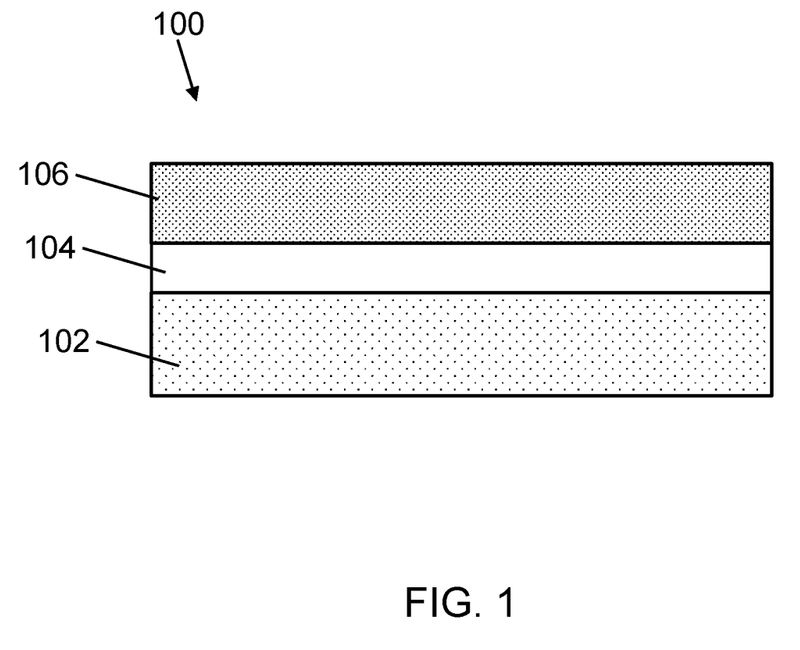
FIG. 1 depicts a cross-sectional view of an initial structure to be processed according to embodiments of the disclosure.

Referring to FIG. 1, a preliminary structure 100 (simply "structure" hereafter) suitable to form a lateral bipolar transistor structure according to embodiments of the disclosure is shown. Preliminary structure 100 may be processed as described herein to yield one or more lateral bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained.

Substrate 102 optionally may include embedded elements for electrically separating active materials formed thereon from other regions and/or materials within substrate 102. An insulator 104 optionally may be formed on substrate 102, e.g., by forming a layer of dielectric material (e.g., oxide or nitride insulative material), converting silicon material within substrate 102 into a higher-resistive material such as polycrystalline or amorphous silicon (poly-Si), or other techniques. An emitter/collector (E/C) layer 106 may be on insulator 104 and may include any currently known or later developed semiconductor material (e.g., any of those described herein regarding substrate 102). E/C layer 106 may be formed by deposition and/or epitaxial growth of silicon and/or other semiconductor materials on insulator 104 and may have a predetermined doping type, e.g., by being doped in-situ or during formation of E/C layer. According to an example, E/C layer 106 may be highly doped N type to provide active semiconductor material for use in an eventual lateral bipolar transistor structure.

Insulator 104 may extend horizontally throughout structure 100, and/or may be formed selectively under locations where active materials are formed, examples of which are discussed elsewhere herein. In further implementations, insulator 104 may include oxygen doping to form a dielectric insulator or a buried oxide ("BOX") layer over substrate 102 to electrically isolate E/C layer 106 from substrate 102. Insulator 104 thus may include other elements or molecules such as Ge, N, or Si. However embodied, insulator 104 may be sized as narrow as possible to provide better interaction with overlying semiconductor materials (e.g., E/C layer 106 and components formed thereon or therefrom), and in various embodiments may have a thickness that is at most approximately twenty-five nanometers (nm) to approximately five-hundred nm. Some portions (not shown) of substrate 102 may not have insulator 104 thereover, and/or multiple layers of insulator 104 may be formed on substrate 102 to varying thicknesses. Additionally, various conductive particles ("dopants") may be introduced into substrate 102 via a process known as "pre-doping" of substrate 102.

Figure 2:
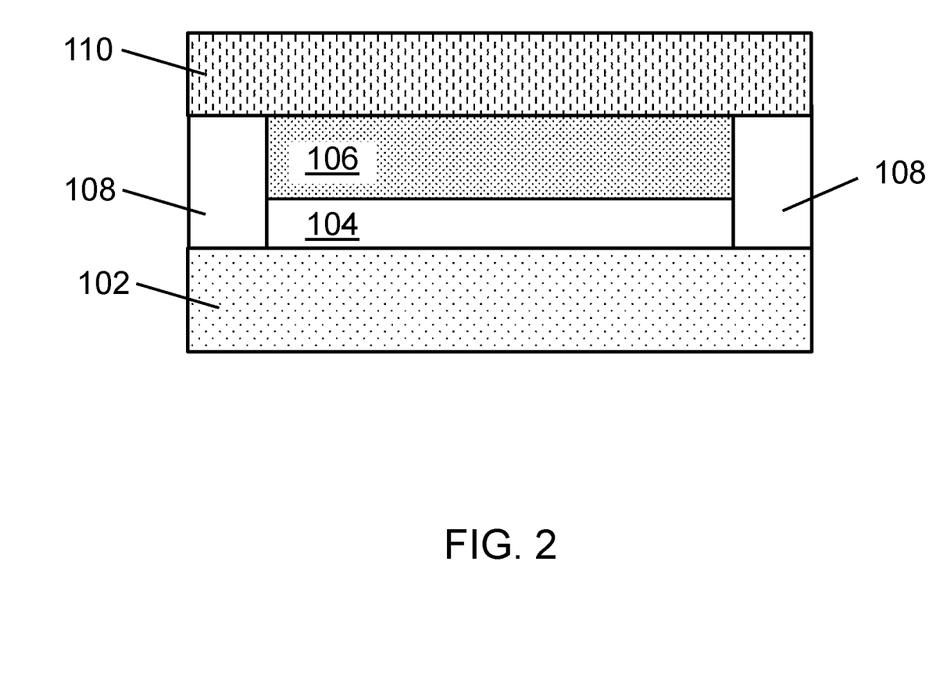
FIG. 2 depicts a cross-sectional view of forming trench isolations (TIs) and a spacer layer according to embodiments of the disclosure.

Turning to FIG. 2, processing of structure 100 may include forming a set of trench isolations (TIs) 108 by forming and filling trenches (not labeled) with an insulating material such as oxide, to horizontally isolate insulator 104 and E/C layer 106 from any adjacent regions of material. Various portions of a bipolar transistor structure, including the active semiconductor materials thereof and/or other devices where applicable, may be formed on or from portions of insulator 104 and E/C layer 106 that are isolated by TI(s) 108. According to one example, two TIs 108 are formed, with insulator 104 and E/C layer 106 being horizontally between the two TIs 108. TIs 108 may be formed before active materials are formed over substrate 102, but this is not necessarily true in all implementations.

Each TI 108 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI(s) 108 and E/C layer 106 may be planarized (e.g., by chemical mechanical planarization or other technique(s)) such that the upper surface(s) of E/C layer(s) 106 is/are substantially coplanar with the upper surface of adjacent TIs 108.

FIG. 2 depicts forming a spacer layer 110 on E/C layer 106 and TI(s) 108. Spacer layer 110 can be provided as one or more bodies of insulating material formed on the upper surface of a material, e.g., by deposition, thermal growth, etc., to electrically and physically insulate materials subsequently formed on the coated material(s) from other components. According to an example, spacer layer 110 may have one or more nitride insulator materials (e.g., SiN) to a desired thickness. In some implementations, spacer layer 110 may include a single layer or more than two layers.

Figure 3:
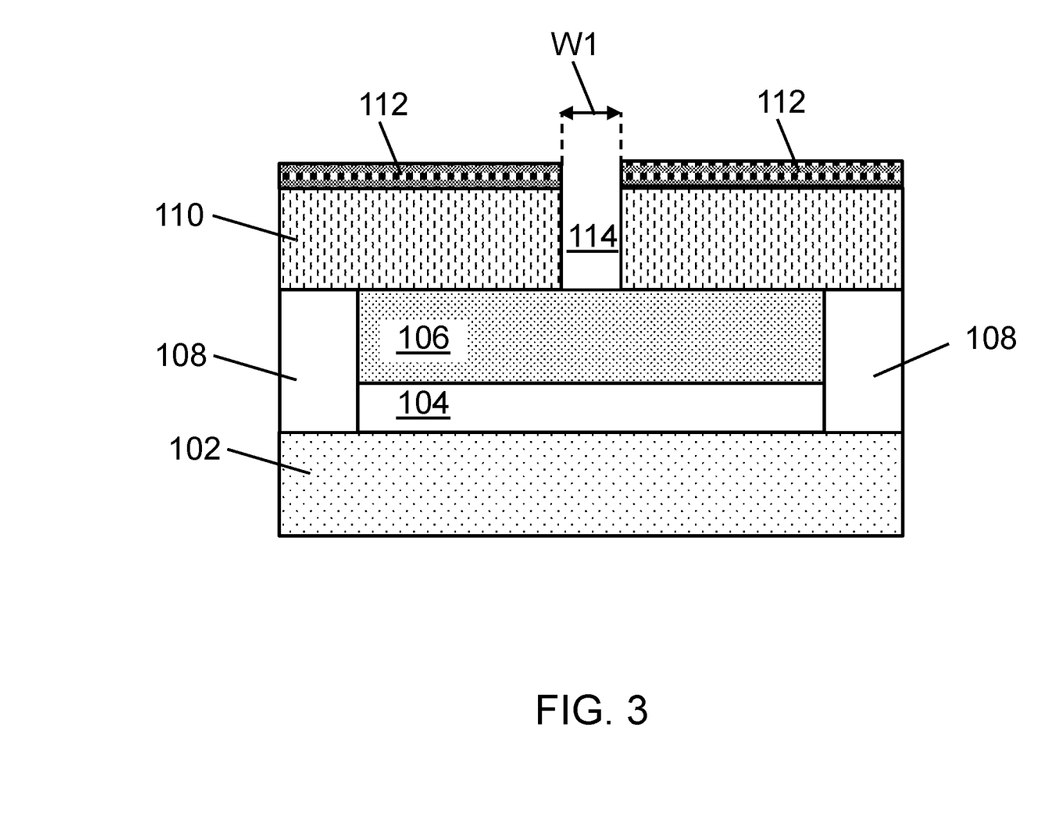
FIG. 3 depicts a cross-sectional view of forming an opening in the spacer layer according to embodiments of the disclosure.

Referring now to FIG. 3, embodiments of the disclosure may include removing portions of spacer layer 110 using a mask 112 to form a first opening 114 at a targeted position to expose E/C layer 106. This removal process may include, for example, forming mask 112 that is patterned to expose selected portion(s) of spacer layer 110. Mask 112 may include any now known or later developed appropriate masking material, e.g., a nitride hard mask. As shown in FIG. 3, any appropriate etching process, e.g., a reactive ion etch (RIE), can remove spacer layer 110, to expose E/C layer 106. This process can be carried out at any location where doped semiconductor material to define the base of an eventual bipolar transistor structure will be formed. The use of mask 112 may produce first opening 114 with horizontal width W1 that is significantly less than the horizontal width of a conventional base material sized for bipolar transistors. For instance, horizontal width W1 of first opening 114 may be at most approximately ten nanometers (nm). Horizontal width W1 of first opening 114 may define the horizontal width of an eventual base material formed therein.

Figure 4:
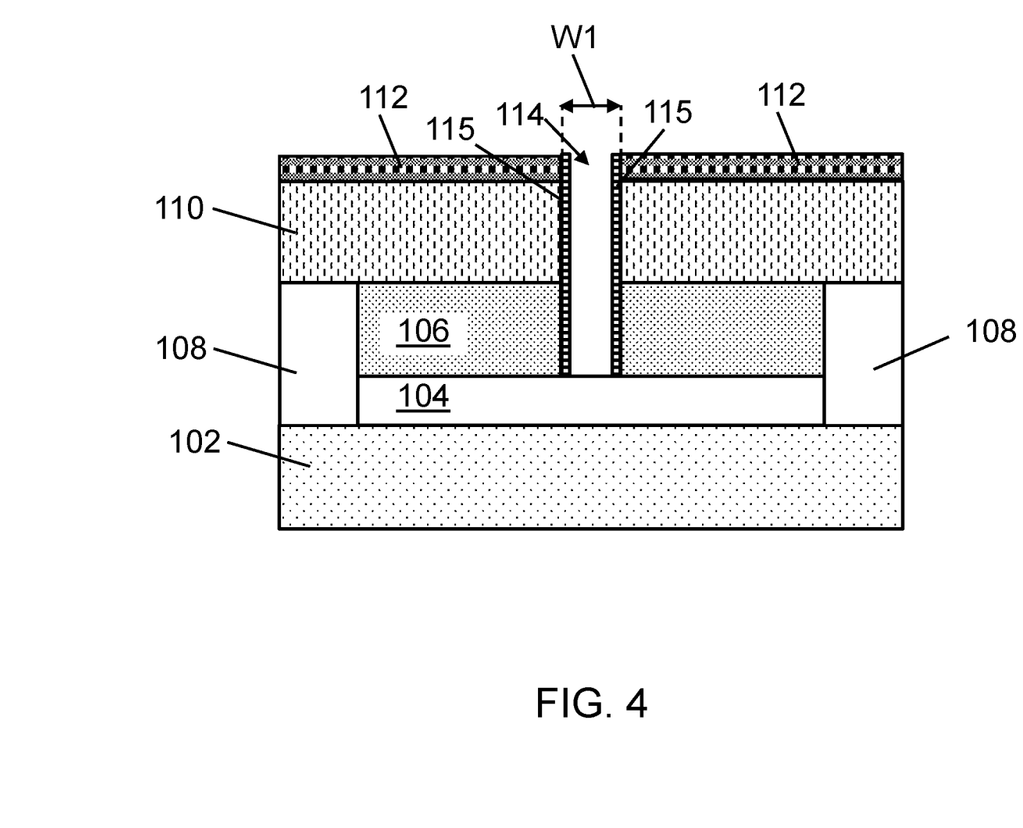
FIG. 4 depicts deepening the opening and forming a sidewall spacer within the opening according to embodiments of the disclosure.

FIG. 4 depicts a process to deepen first opening 114, e.g., by removing portions of E/C layer 106 below opening 114 to expose insulator 104. At this point, a set of sidewall spacers 115 (e.g., one or more additional layers of insulative material or masking material) may be formed by conformal deposition of such material on the sidewalls of opening 114. Sidewall spacers 115 may be formed, e.g., to prevent epitaxial growth and/or other formation of semiconductor materials on the sidewalls of opening 114 in subsequent processing until such material is specifically desired.

Figure 5:
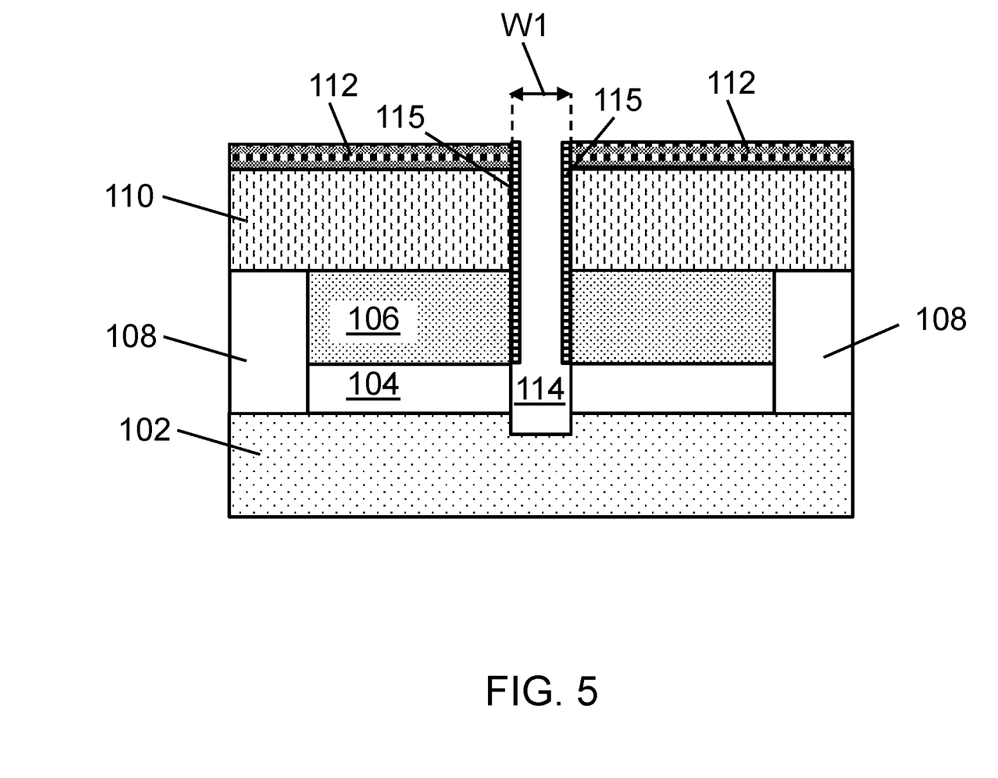
FIG. 5 depicts a cross-sectional view of deepening the opening through a base layer, insulator, and portion of a substrate according to embodiments of the disclosure.

FIG. 5 depicts removing portions of insulator 104 below first opening 114, and optionally, a portion of substrate 102 thereunder. To deepen first opening 114, continued processing may include further use of RIE and/or other types of directional etching to remove insulator 104 without increasing the width of first opening 114. At this stage, portions of substrate 102 may be exposed at the bottom of first opening 114. Additionally, horizontal width W1 of first opening 114 may be substantially unchanged (e.g., at most approximately 10 nm).

Figure 6:
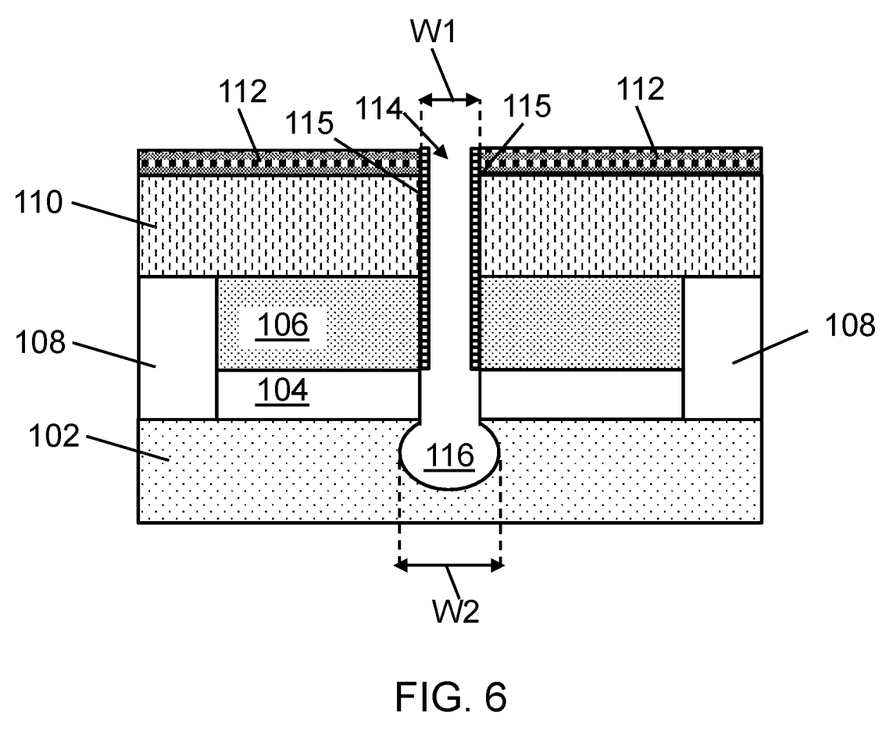
FIG. 6 depicts a cross-sectional view of removing additional portions of the substrate to expand the opening according to embodiments of the disclosure.

FIG. 6 depicts forming a second opening 116 that is below, and contiguous with, first opening 114. Second opening 116 may be formed, e.g., by performing a "ball etch," selectively etching substrate 102 (e.g., in the case where substrate 102 includes Si and E/C layer 106 includes SiGe), or other processes to remove only exposed portions of substrate 102 within first opening 114. The term "ball etch," as used herein, refers to an etching process in which a wet etchant (e.g., nitric acid and hydrofluoric acid mix, potassium hydroxide, etc.) or other etchant with similar properties is introduced within an opening to remove semiconductor material that is located at the bottom of an opening. The removed material may take on a rounded or "ball" type shape, thereby defining space that is larger than the overlying opening. Second opening 116 thus may have a horizontal width W2 that is larger than horizontal width W1 of first opening 114. Mask 112 then be removed (e.g., by stripping or other mask removal techniques) after opening(s) 114, 116 are formed. Continued processing may form active semiconductor material(s) within openings 114, 116.

Figure 7:
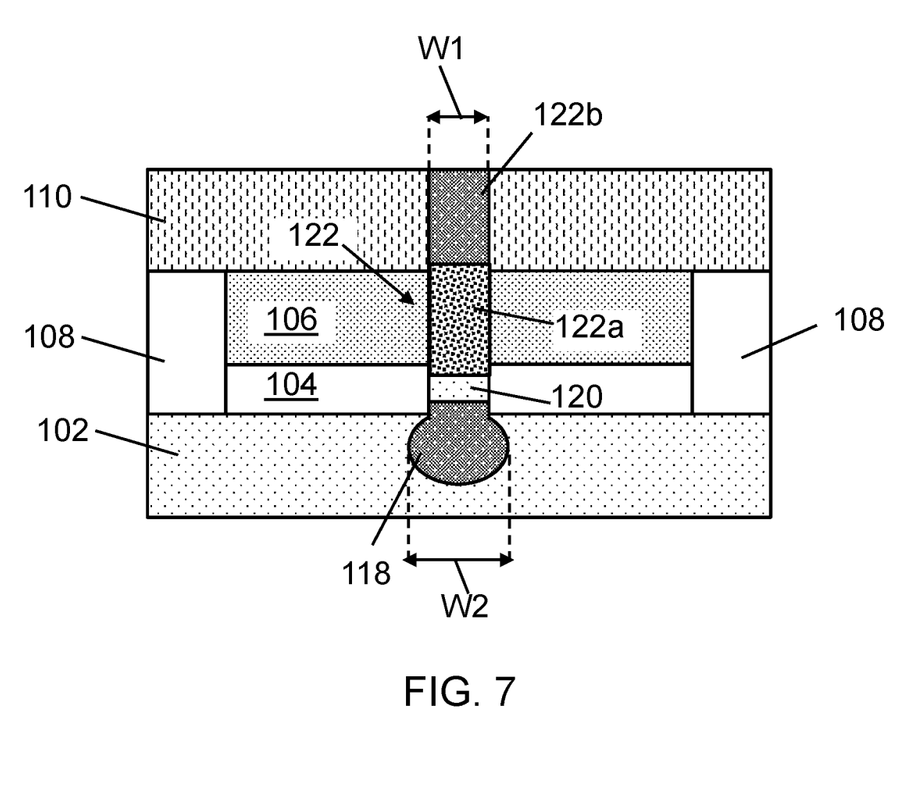
FIG. 7 depicts a cross-sectional view of forming a base layer within the opening according to embodiments of the disclosure.

Turning to FIG. 7, embodiments of the disclosure may include forming a doped semiconductor region 118 within the space that previously defined second opening 116 (FIG. 6). Doped semiconductor region 118 may include silicon germanium (SiGe) with any desired germanium concentration, and/or silicon or other semiconductor materials with various dopant species (e.g., carbon doping). Doped semiconductor region 118 may be more electrically and thermally conductive than the composition of substrate 102 thereunder. Doped semiconductor region 118 may be located adjacent substrate 102, and in some cases, may also be adjacent a portion of insulator 104 thereover.

Continued processing may include forming a semiconductor buffer 120 adjacent insulator 104, e.g., on doped semiconductor region 118. Semiconductor buffer 120 may include, e.g., non-doped semiconductor material formed on doped semiconductor region 118. Semiconductor buffer 120 may be horizontally adjacent insulator 104 and may span across horizontal width W1 over doped semiconductor region 118. During operation, semiconductor buffer 120 defines an electrical barrier to prevent electric current in overlying active semiconductor materials from entering doped semiconductor region 118. This property of semiconductor buffer 120 arises from the absence of dopants and/or other electrically active material(s) in its composition. The vertical thickness of semiconductor buffer 120 can be at most approximately equal to that of insulator 104, e.g., such that no portion of semiconductor buffer 120 is adjacent E/C layer 106 or substrate 102.

A base layer 122 may be formed by deposition and/or epitaxial growth of silicon germanium (SiGe) and/or other semiconductor materials within opening 114 (FIGS. 5, 6). Before base layer 122 is formed, sidewall spacer(s) 115 (FIGS. 4-6) may be removed by selective etching and/or other processes to target and remove the material(s) within sidewall spacers 115. Base layer 122 optionally may have the opposite doping type from E/C layer 106 (e.g., it may be doped N type when E/C layer 106 is doped P type and vice versa). Base layer 122 also may be of the same doping type as doped semiconductor region 118 below semiconductor buffer 120. Base layer 122 can be formed for example by selectively growing silicon material above semiconductor buffer 120. Base layer 122 may have a higher concentration of dopants than semiconductor buffer 120 (which is electrically inactive), or doped semiconductor region 118. Base layer 122 may have a width that is approximately equal a width of semiconductor buffer 120, e.g., due to being formed within opening 114 on semiconductor buffer 120.

In the eventual lateral bipolar transistor structure, base layer 122 may be subdivided into a lightly doped intrinsic base region 122a on semiconductor buffer 120, and a highly doped extrinsic base region 122b on intrinsic base region 122a. In some cases, intrinsic base region 122a may be adjacent E/C layer 106 and extrinsic base region 122b may be adjacent spacer layer 110. The higher dopant concentration in extrinsic base region 122b may increase electrical conductivity between base layer 122 and any overlying contacts for controlling the flow of current through the lateral bipolar transistor structure. Regions 122a, 122b of base layer 122 may be distinguished during manufacture by the dopant concentration therein. For instance, base layer 122 may be formed with a first dopant concentration to a desired vertical thickness to define intrinsic base 122a, and more highly doped material may be formed thereover to define extrinsic base 122b. When base layer 122 is formed by deposition or non-selective growth, it may be planarized by use of chemical mechanical planarization (CMP) such that its upper surface is substantially coplanar with adjacent spacer layer(s) 110.

Figure 8:
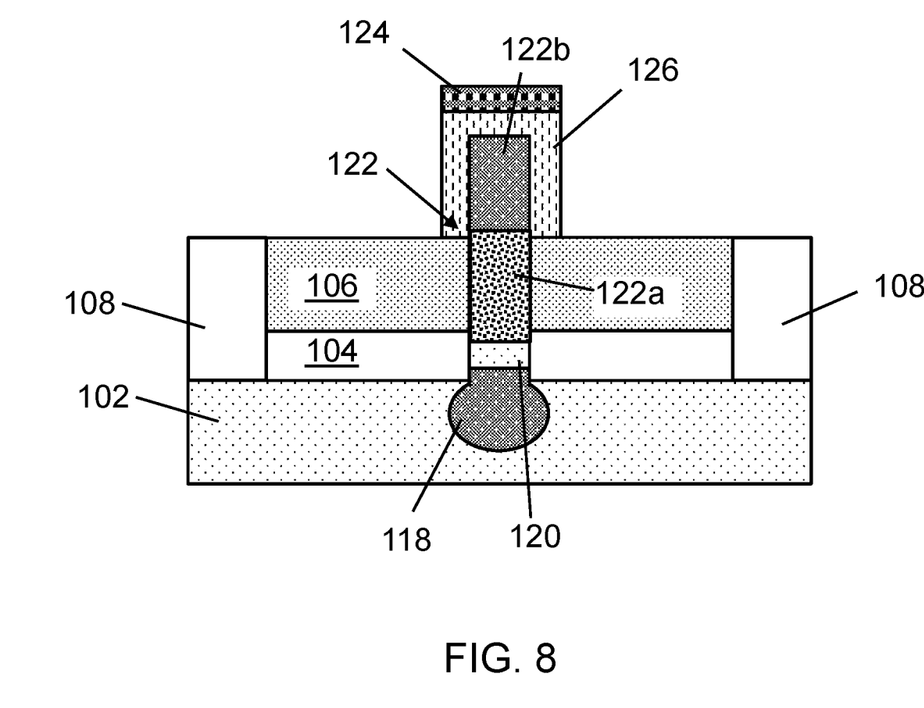
FIG. 8 depicts a cross-sectional view of forming a spacer on an upper portion of the base layer according to embodiments of the disclosure.

Turning to FIG. 8, continued processing may include forming a spacer mask 124 (e.g., one or more layers of photoresist material) over portions of spacer layer 110 (FIGS. 1-7) that are above base layer 122 and removing other portions of spacer material to form a spacer 126 about base layer 122. Spacer 126 may be formed, e.g., by removing spacer material not covered by spacer mask 124 to expose E/C layer 106 and TI(s) 108 (or otherwise to a predetermined depth), leaving other parts of the spacer material intact alongside and over base layer 122. To provide this effect, spacer mask 124 may have a greater horizontal width than base layer 122 such that spacer mask 124 covers portions of spacer layer 110 that are alongside base layer 122.

Figure 9:
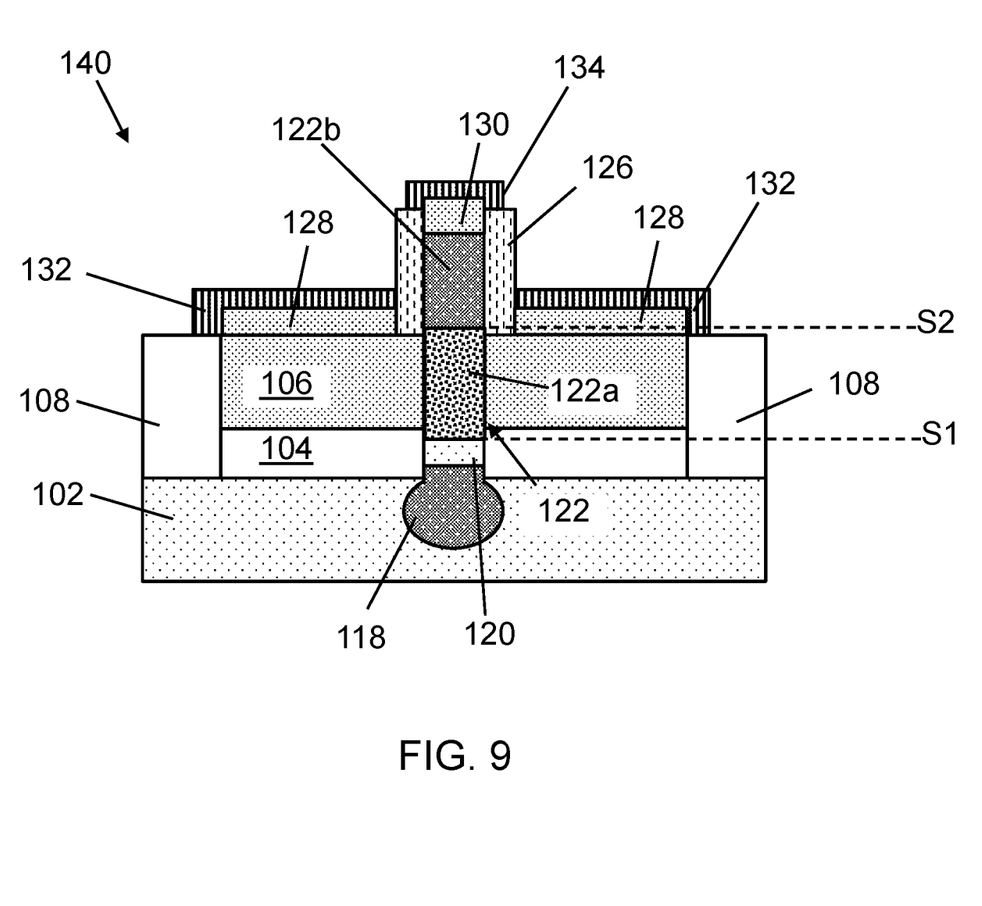
FIG. 9 depicts a cross-sectional view of forming emitter/collector (E/C) terminals and silicide layers according to embodiments of the disclosure.

Turning to FIG. 9, embodiments of the disclosure may include forming the active bipolar transistor materials on E/C layer 106 and base layer 122. For example, a set of E/C terminals 128 may be formed on respective portions of E/C layer 106, e.g., by epitaxial growth or deposition of doped semiconductor material. E/C terminals 128 may include the same material composition as E/C layer 106 (e.g., doped SiGe) or may include other electrically active semiconductor materials. E/C terminals 128 may be formed to a desired thickness above E/C layer 106, e.g., such that spacer 126 horizontally separates each E/C terminal 128 from base layer 122 (e.g., extrinsic base region 122b thereof). Continued processing also may include forming a base terminal 130 over base layer 122, e.g., by removing a portion of spacer 126 thereover and forming semiconductor material on top of base layer 122. Base terminal 130 may be formed by deposition or epitaxial growth of semiconductor material on base layer 122, and optionally may be formed simultaneously with E/C terminal(s) 128.

FIG. 9 also depicts forming an E/C silicide layer 132 on E/C terminal(s) 128 and a base silicide layer 134 on base terminal 130. Silicide layers 132, 134 may be formed to enhance the electrical conductivity between terminals 128, 130 and conductors formed thereon. Silicide layers 132, 134 may be formed by forming a conductive metal (e.g., cobalt, titanium, nickel, platinum, or other materials) on terminals 128, 130, annealing the metal to yield conductive silicide material(s) (e.g., cobalt silicide, titanium silicide, etc.) on upper surfaces of terminals 128, 130, and removing excess conductive metal. Silicide layers 132, 134 may be formed to allow for stronger electrical coupling to overlying contacts.

At this stage, the structure provides a lateral bipolar transistor structure 140. Specifically, lateral bipolar transistor structure 140 includes E/C layer 106 of a first doping type (e.g., P type doping) over insulator 104. Semiconductor buffer 120 is adjacent insulator 104, and below base layer 122. Base layer 122, in turn, is doped oppositely from E/C layer 106 and located over semiconductor buffer 120 and adjacent E/C layer 106. Base layer 106 has a lower surface 51 that is below E/C layer 106, and an upper surface S2 that is above E/C layer 106. In this configuration, base layer 122 may have substantially less horizontal width than E/C layer 106. Additionally, semiconductor buffer 120 alongside insulator 104 may prevent base layer 122 from being conductively coupled to substrate 102 through doped semiconductor region 118, despite doped semiconductor region 118 possibly being the seed layer from which base layer 122 is formed. Further processing may include forming additional components to electrically connect lateral bipolar transistor structure 140 to other portions of a device. Base layer 122 may have horizontal width W1 that is less than horizontal width W2 of doped semiconductor region 118. Moreover, horizontal width W1 of base layer 122 may be substantially less than the width of base material(s) in a conventional lateral bipolar transistor. Due to the size of first opening 114 (FIGS. 4-6) and the forming of doped semiconductor region 118 as seed material in second opening 116 (FIG. 6), doped semiconductor region 118 will have a greater horizontal width (horizontal width W2) than base layer 122 (horizontal width W1).

Figure 10:
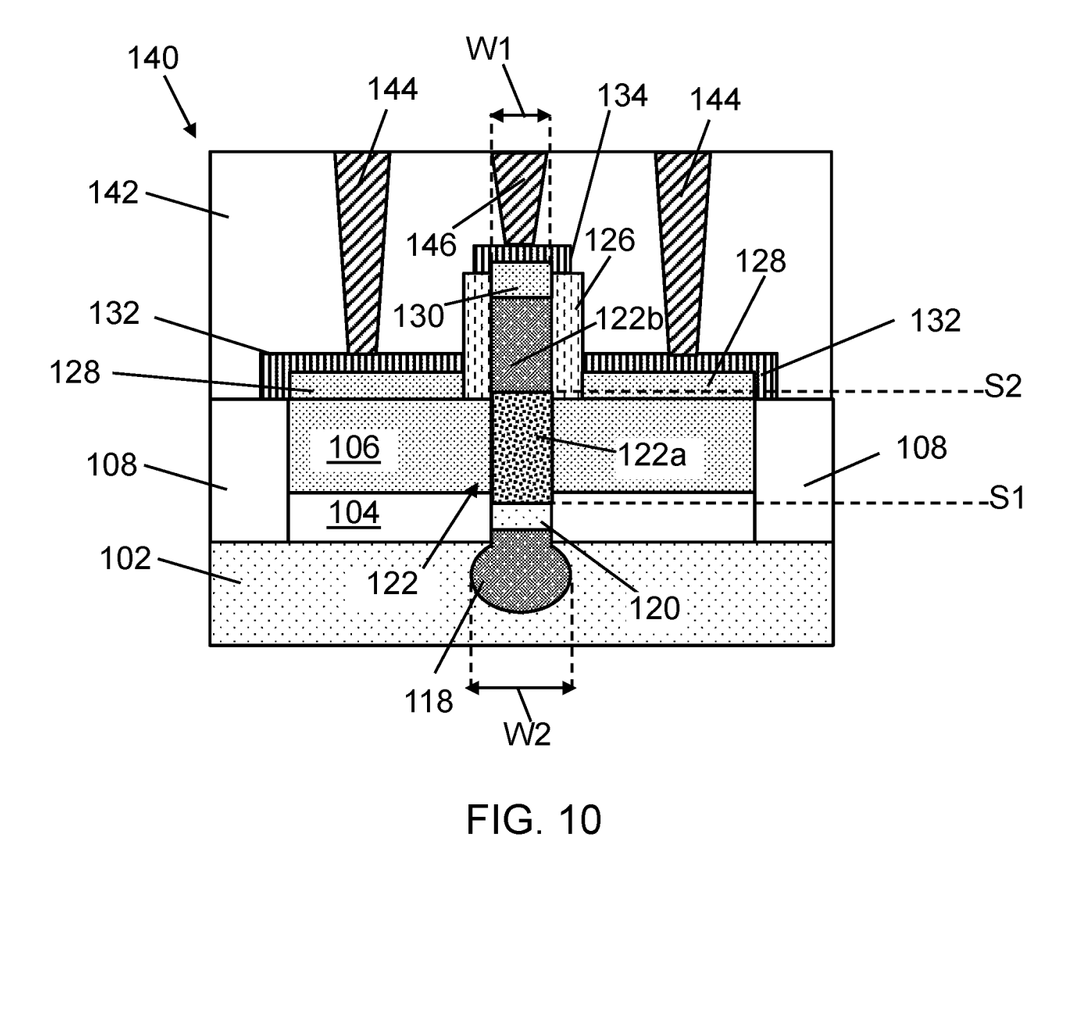
FIG. 10 depicts a cross-sectional view of a lateral bipolar transistor structure according to embodiments of the disclosure.
Figure 11:
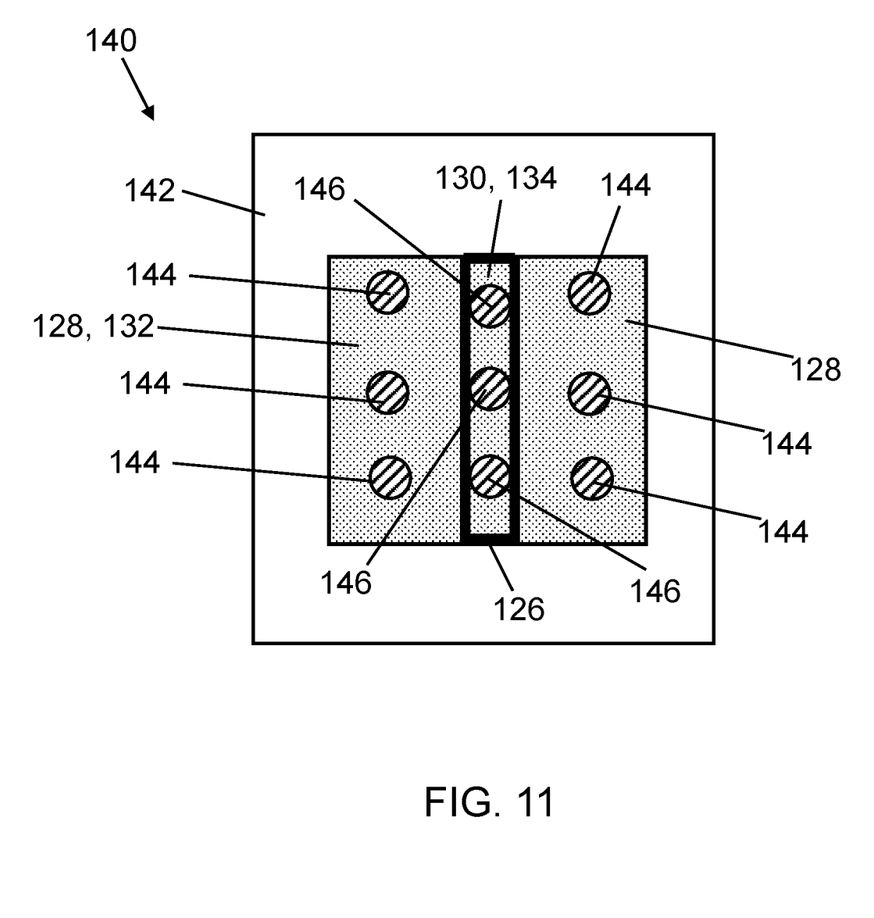
FIG. 11 depicts a plan view of a lateral bipolar transistor structure according to embodiments of the disclosure.

FIGS. 10 and 11 depict the forming of additional insulative and conductive components for physically and electrically defining lateral bipolar transistor structure 140 relative to other parts of a device. An inter-level dielectric (ILD) layer 142 can be formed over bipolar transistor structure 140 e.g., by deposition or other techniques of forming an insulative material on a structure. Additional metallization layers (not shown) may be formed on ILD layer 142 during middle-of-line and/or back-end-of-line processing. To electrically couple various components discussed herein to such metallization layers, a set of E/C contacts 144 may be formed to E/C terminals 128 (e.g., via E/C silicide layers 132) and within ILD layer 142. Similarly, a set of base contacts 146 may be formed on base terminal 130 (e.g., via base silicide layer 134) and within ILD layer 142.

One or more of contacts 144, 146 to overlying circuit elements may be formed within predetermined portions of ILD layer 142 by a controlled amount of vertical etching to form openings to one or more contact sites, and then filling the openings with a conductor. Each contact 144, 146 may include any currently known or later developed conductive material configured for use in an electrical contact, e.g., tungsten (W), copper (Cu), aluminum (Al), gold (Au), etc. Contacts 144, 146 may additionally include refractory metal liners (not shown) positioned alongside ILD layer 142 to prevent electromigration degradation, shorting to other components, etc. As shown in FIG. 11, multiple contacts 144, 146 may be formed to the same E/C terminal 128 or base terminal 130, respectively. With ILD layer 142 in place, an upper portion of spacer 126 may be horizontally between extrinsic base layer 122b and ILD layer 142, while a lower portion of spacer 126 may be horizontally between base layer 122 and E/C terminal(s) 128.

Embodiments of the disclosure may provide several technical advantages. Lateral bipolar transistor structure 140 includes base layer 122 with an advantageously narrow horizontal width (denoted as width W1 along the horizontal direction) that nonetheless abuts E/C layer 106 to form an electrically active heterojunction. The use of doped semiconductor layer 118 as a seed layer, and semiconductor buffer 120 as an electrically inactive layer adjacent insulator 104, allow higher quality base material (e.g., doped SiGe) to be formed thereover as compared to other types of bipolar transistors. Additionally, doped semiconductor layer 118 may allow heat dissipation from lateral bipolar transistor structure 140 into substrate 102, despite the presence of semiconductor buffer 120 as an electrical insulator. These and other features of the disclosure may provide improvements to gain and frequency of operation, e.g., due to increased electron mobility. Embodiments of the disclosure can be implemented using existing CMOS processing techniques and/or masking materials.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A lateral bipolar transistor structure comprising:
   a doped semiconductor region within a substrate, the doped semiconductor region including a material composition distinct from a material composition of the substrate;
   an emitter/collector (E/C) layer over an insulator over the substrate, the E/C layer having a first doping type;
   a semiconductor buffer adjacent the insulator; and
   a base layer on the semiconductor buffer and adjacent the E/C layer, the base layer including a lower surface below the E/C layer and an upper surface above the E/C layer, wherein the base layer has a second doping type opposite the first doping type.

2. The lateral bipolar transistor structure of claim 1, wherein the base layer includes:
   an intrinsic base region over the semiconductor buffer and adjacent the E/C layer; and
   an extrinsic base region over the intrinsic base region, wherein a dopant concentration within the extrinsic base region is greater than a dopant concentration within the intrinsic base region.

3. The lateral bipolar transistor structure of claim 1, wherein a horizontal width of the doped semiconductor region is greater than a horizontal width of the semiconductor buffer.

4. The lateral bipolar transistor structure of claim 1, wherein a horizontal width of the semiconductor buffer is approximately equal to a horizontal width of the base layer.

5. The lateral bipolar transistor structure of claim 1, further comprising:
   a E/C terminal on the E/C layer; and
   a base terminal on the base layer, wherein the base terminal is above the E/C terminal.

6. The lateral bipolar transistor structure of claim 5, further comprising a spacer on the E/C layer, the spacer including a lower portion horizontally between the E/C terminal and the base layer, and an upper portion horizontally between an inter-level dielectric (ILD) layer and the base terminal.

7. The lateral bipolar transistor structure of claim 1, wherein the doped semiconductor region includes an uppermost surface above an uppermost surface of the substrate.

8. The lateral bipolar transistor structure of claim 1, wherein the doped semiconductor region includes curved side surfaces.

9. A lateral bipolar transistor structure comprising:
   a semiconductor substrate;
   an insulator on the semiconductor substrate;
   an emitter/collector (E/C) layer on the insulator, the E/C layer having a first doping type;

a semiconductor buffer above the semiconductor substrate and adjacent the insulator, wherein the semiconductor buffer is below the E/C layer;

a doped semiconductor region below the semiconductor buffer and within the semiconductor substrate, the doped semiconductor region including a material composition distinct from a material composition of the substrate; and a base layer on the semiconductor buffer and adjacent the E/C layer, the base layer including a lower surface below the E/C layer and an upper surface above the E/C layer, the base layer having a second doping type opposite the first doping type.

10. The lateral bipolar transistor structure of claim 9, wherein the base layer includes:

an intrinsic base region over the semiconductor buffer and adjacent the E/C layer; and an extrinsic base region over the intrinsic base region, a dopant concentration within the extrinsic base region being greater than a dopant concentration within the intrinsic base region.

11. The lateral bipolar transistor structure of claim 9, wherein a horizontal width of the doped semiconductor region is greater than a horizontal width of the semiconductor buffer.

12. The lateral bipolar transistor structure of claim 9, wherein a horizontal width of the semiconductor buffer is approximately equal to a horizontal width of the base layer.

13. The lateral bipolar transistor structure of claim 9, further comprising:

a E/C terminal on the E/C layer; and a base terminal on the base layer, wherein the base terminal is above the E/C terminal.

14. The lateral bipolar transistor structure of claim 13, further comprising a spacer on the E/C layer, the spacer including a lower portion horizontally between the E/C terminal and the base layer, and an upper portion horizontally between an inter-level dielectric (ILD) layer and the base terminal.

15. The lateral bipolar transistor structure of claim 9, wherein the doped semiconductor region includes an uppermost surface above an uppermost surface of the substrate.

16. The lateral bipolar transistor structure of claim 9, wherein the doped semiconductor region includes curved side surfaces.

17. A method of forming a lateral bipolar transistor structure, the method comprising:

forming an emitter/collector (E/C) layer over an insulator, the E/C layer having a first doping type;

forming a doped semiconductor region within a substrate below the insulator, the doped semiconductor region including a material composition distinct from a material composition of the substrate;

forming a semiconductor buffer adjacent the insulator and on the doped semiconductor region; and forming a base layer on the semiconductor buffer and adjacent the E/C layer, the base layer including a lower surface below the E/C layer and an upper surface above the E/C layer, wherein the base layer has a second doping type opposite the first doping type.

18. The method of claim 17, wherein forming the base layer includes:

forming an intrinsic base region over the semiconductor buffer and adjacent the E/C layer; and forming an extrinsic base region over the intrinsic base region, wherein a dopant concentration within the extrinsic base region is greater than a dopant concentration within the intrinsic base region.

19. The method of claim 17, further comprising:

forming a E/C terminal on the E/C layer; and forming a base terminal on the base layer, the base terminal being above the E/C terminal.

20. The method of claim 19, further comprising forming a spacer on the E/C layer, the spacer including a lower portion horizontally between the E/C terminal and the base layer, and an upper portion horizontally between an inter-level dielectric (ILD) layer and the base terminal.

* * * * *